United States Patent
Zhao et al.

(10) Patent No.: US 10,697,063 B2
(45) Date of Patent: Jun. 30, 2020

(54) CORNER SPOILER FOR IMPROVING PROFILE UNIFORMITY

(71) Applicant: Applied Materials, Inc., Santa Clara, CA (US)

(72) Inventors: Lai Zhao, Campbell, CA (US); Gaku Furuta, Sunnyvale, CA (US); Qunhua Wang, Santa Clara, CA (US); Robin L. Tiner, Santa Cruz, CA (US); Beom Soo Park, San Jose, CA (US); Soo Young Choi, Fremont, CA (US); Sanjay D. Yadav, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1139 days.

(21) Appl. No.: 14/610,489

(22) Filed: Jan. 30, 2015

(65) Prior Publication Data

US 2015/0211120 A1    Jul. 30, 2015

Related U.S. Application Data

(60) Provisional application No. 61/933,737, filed on Jan. 30, 2014.

(51) Int. Cl.
*C23C 16/00* (2006.01)
*C23C 16/455* (2006.01)
(Continued)

(52) U.S. Cl.
CPC .... *C23C 16/45591* (2013.01); *C23C 16/4585* (2013.01); *C23C 16/45563* (2013.01);
(Continued)

(58) Field of Classification Search
CPC .......... C23C 16/45591; H01J 37/32651; H01J 37/32623
See application file for complete search history.

(56) References Cited

U.S. PATENT DOCUMENTS

| 5,582,866 A | 12/1996 | White |
| 2002/0033183 A1* | 3/2002 | Sun ................ B08B 7/0035 134/1.1 |

(Continued)

FOREIGN PATENT DOCUMENTS

| CN | 1591793 A | 3/2005 |
| CN | 100575547 C | 12/2009 |

(Continued)

OTHER PUBLICATIONS

English translation KR 100903306, Cho, Jun. 2009.*

(Continued)

*Primary Examiner* — Keath T Chen
(74) *Attorney, Agent, or Firm* — Patterson + Sheridan LLP

(57) ABSTRACT

The present disclosure relates to a corner spoiler designed to decrease high deposition rates on corner regions of substrates by changing the gas flow. In one embodiment, a corner spoiler for a processing chamber includes an L-shaped body fabricated from a dielectric material, wherein the L-shaped body is configured to change plasma distribution at a corner of a substrate in the processing chamber. The L-shaped body includes a first and second leg, wherein the first and second legs meet at an inside corner of the L-shaped body. The length of the first or second leg is twice the distance defined between the first or second leg and the inside corner. In another embodiment, a shadow frame for a depositing chamber includes a rectangular shaped body having a rectangular opening therethrough, and one or more corner spoilers coupled to the rectangular shaped body at corners of the rectangular shaped body.

10 Claims, 4 Drawing Sheets

(51) Int. Cl.
*H01J 37/32* (2006.01)
*C23C 16/458* (2006.01)

(52) U.S. Cl.
CPC .. *H01J 37/32091* (2013.01); *H01J 37/32623* (2013.01); *H01J 37/32651* (2013.01)

(56) References Cited

U.S. PATENT DOCUMENTS

| | | | |
|---|---|---|---|
| 2004/0071874 A1* | 4/2004 | Shimizu | C23C 16/4409 427/248.1 |
| 2004/0139917 A1 | 7/2004 | Yamaguchi et al. | |
| 2006/0005771 A1 | 1/2006 | White et al. | |
| 2006/0011137 A1 | 1/2006 | Keller | |
| 2006/0228496 A1* | 10/2006 | Choi | H01J 37/32449 427/569 |
| 2007/0169891 A1* | 7/2007 | Koshiishi | H01J 37/32642 156/345.47 |
| 2007/0264441 A1* | 11/2007 | Ishibashi | H01J 37/32192 427/488 |
| 2008/0152838 A1 | 6/2008 | Sen et al. | |
| 2008/0282982 A1 | 11/2008 | White et al. | |
| 2010/0288197 A1* | 11/2010 | Choi | C23C 16/4404 118/723 R |
| 2011/0053356 A1* | 3/2011 | Yang | C23C 16/24 438/488 |
| 2011/0304086 A1* | 12/2011 | Liu | B23K 20/122 269/296 |
| 2013/0119863 A1 | 5/2013 | Hanawa | |
| 2013/0228124 A1 | 9/2013 | Furuta et al. | |
| 2013/0263782 A1 | 10/2013 | Wang et al. | |
| 2014/0158046 A1* | 6/2014 | Kim | C23C 16/042 118/505 |

FOREIGN PATENT DOCUMENTS

| | | |
|---|---|---|
| CN | 102002687 A | 4/2011 |
| CN | 102034678 A | 4/2011 |
| CN | 103107058 A | 5/2013 |
| EP | 0 825 279 A1 | 2/1998 |
| JP | 2006-049640 A | 2/2006 |
| KR | 10-0903306 B1 | 6/2009 |
| KR | 2010-0014598 A | 2/2010 |
| KR | 2011-0020879 A | 3/2011 |
| WO | 2010/132716 A2 | 11/2010 |

OTHER PUBLICATIONS

PCT Notification of Transmittal of the International Search Report and the Written Opinion of the International Searching Authority for International Application No. PCT/2014/040968 dated Nov. 25, 2014; 11 total pages.
PCT Notification of Transmittal of the International Search Report and the Written Opinion of the International Searching Authority for International Application No. PCT/US2015/012014 dated Apr. 8, 2015; 13 total pages.
Japanese Office Action (with attached English translation) for Application No. 2016-544828; dated Jun. 26, 2018; 6 total pages.
Taiwanese Office Action for Application No. 104102081; dated Nov. 23, 2018; 5 total pages.
Taiwanese Office Action (with attached English translation) for Application No. 104102081; dated Jun. 29, 2018; 21 total pages.
Chinese Office Action (with attached English translation) for Application No. 201580006277.8; dated Jul. 17, 2019; 11 total pages.
Chinese Office Action (with attached English translation) for Application No. 20180006277.8; dated Jan. 25, 2019; 12 total pages.

* cited by examiner

CORNER SPOILER FOR IMPROVING PROFILE UNIFORMITY

CROSS-REFERENCE TO RELATED APPLICATIONS

This application claims benefit of U.S. Provisional Patent Application Ser. No. 61/933,737, filed Jan. 30, 2014, which is hereby incorporated herein by reference.

BACKGROUND OF THE DISCLOSURE

Field

Embodiments of the disclosure generally relate to a corner spoiler for improving profile uniformity and method for distributing gas in a processing chamber.

Description of the Background Art

Liquid crystal displays or flat panels are commonly used for active matrix displays such as computer and television monitors. Plasma enhanced chemical vapor deposition (PECVD) is generally employed to deposit thin films on a substrate such as a transparent substrate for flat panel display or semiconductor wafer. PECVD is generally accomplished by introducing a precursor gas or gas mixture, e.g., silane ($SiH_4$) and nitrogen ($N_2$), into a vacuum chamber that contains a substrate. The precursor gas or gas mixture is typically directed downwardly through a distribution plate situated near the top of the chamber. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material, e.g., silicon nitride ($SiN_x$), on a surface of the substrate that is positioned on a temperature controlled substrate support. The silicon nitride layer forms passivation layers, gate insulators, and/or buffer layers for a low temperature poly silicon (LTPS) film stack in the next generation thin film transistors (TFT) and active matrix organic light emitting diodes (AMOLED). TFT and AMOLED are but two types of devices for forming flat panel displays.

Flat panels processed by PECVD techniques are typically large, often exceeding 4 square meters. As the size of substrates continues to grow in the flat panel display industry, film thickness and film uniformity control for large area PECVD becomes an issue. Further, as the substrates are rectangular, edges of the substrate, such as sides and corners thereof, experience conditions that may be different than the conditions experienced at other portions of the substrate. For example, centrally located plasma increases the deposition rate at the corners of the substrate, resulting in "corner peaks". The corner peaks adversely affect processing parameters, such as film thickness, and increase the edge exclusion range. Overall film thickness affects the drain current and the threshold voltage of the flat panel.

Conventional techniques for controlling the deposition rate include modulating the flow of the gas through the gas distribution plate and changing the material of chamber components to affect the impedance of the plasma distribution. However, conventional techniques are often costly and only capable of changing the film uniformity profile at a larger range, e.g., greater than 300 mm from the corner of the substrate.

Therefore, there is a need for improving the deposition rate and film thickness uniformity in substrates, particularly at the corner regions of the substrate.

SUMMARY

The present disclosure generally relates to a corner spoiler designed to decrease high deposition rates on corner regions and/or edge regions of substrates by changing the gas flow.

In one embodiment, a corner spoiler for a processing chamber is provided. The corner spoiler includes an L-shaped body fabricated from a dielectric material. The L-shaped body is configured to change plasma distribution at a corner of a substrate in the processing chamber. The L-shaped body includes a first and second leg, wherein the first and second legs meet an inside corner of the L-shaped body. The length of the first or second leg is twice the distance defined between the first or second leg and the inside corner.

In another embodiment, a shadow frame for a processing chamber is provided. The shadow frame includes a rectangular shaped body having a rectangular opening therethrough. The shadow frame also includes one or more corner spoilers coupled to the rectangular shaped body at corners of the rectangular shaped body. The one or more corner spoilers include an L-shaped body fabricated from a dielectric material. The L-shaped body is configured to change plasma distribution at a corner of a substrate in the processing chamber.

In yet another embodiment, a method for distributing gas in a processing chamber is provided. The method includes using a spoiler to reduce plasma distribution at a corner of a substrate in the processing chamber. The method also includes reducing an electric field disposed below the spoiler.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a corner spoiler designed to decrease high deposition rates on corner regions and/or edge regions of substrates by changing the gas flow. According to embodiments described herein, the corner spoiler reduces the non-uniform depositing rates by adjusting gas flow and reducing the electric field formed below the corner spoiler. The material, size, shape and other features of the corner spoiler can be varied based on the processing requirements and associated deposition rates.

Embodiments herein are illustratively described below in reference to a PECVD system configured to process large area substrates, such as a PECVD system, available from AKT, a division of Applied Materials, Inc., Santa Clara, Calif. However, it should be understood that the disclosure has utility in other system configurations such as etch systems, other chemical vapor deposition systems and any other system in which distributing gas within a process chamber is desired, including those systems configured to process round substrates.

Figure 1:
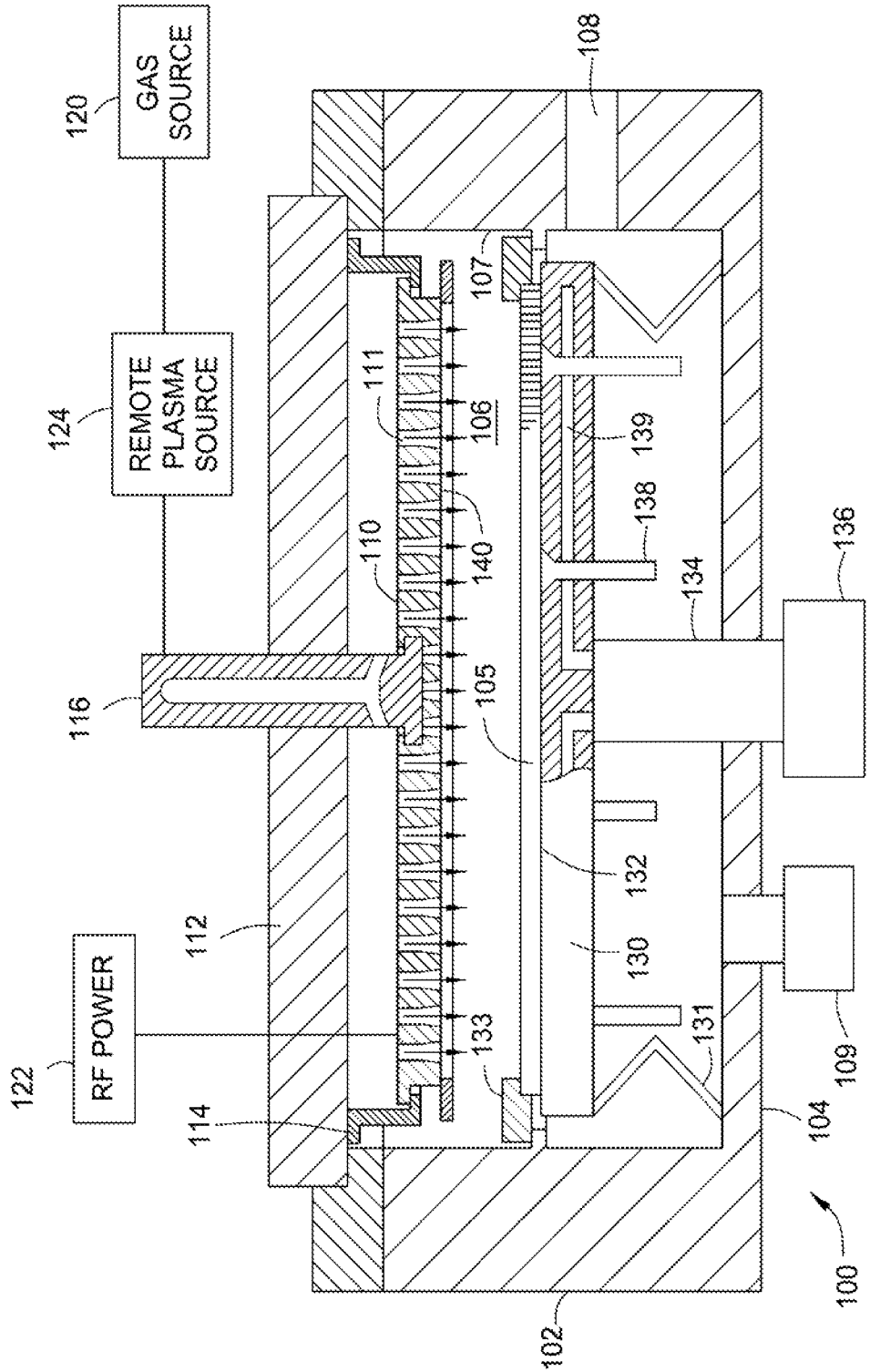
FIG. 1 is a schematic cross-section view of one embodiment of a PECVD chamber.

FIG. 1 is a schematic cross-section view of one embodiment of a PECVD chamber 100 for forming electronic devices, such as TFT and AMOLED. It is noted that FIG. 1 is just an exemplary apparatus that may be used to electronic devices on a substrate. One suitable PECVD chamber is available from Applied Materials, Inc., located in Santa Clara, Calif. It is contemplated that other deposition chambers, including those from other manufacturers, may be utilized to practice the present disclosure.

The chamber 100 generally includes walls 102, a bottom 104, and a gas distribution plate or diffuser 110, and substrate support 130 which define a process volume 106. The process volume 106 is accessed through a sealable slit valve 108 formed through the walls 102 such that a substrate 105, may be transferred in and out of the chamber 100. In one embodiment, the substrate 105 is 1850 mm×1500 mm. The substrate support 130 includes a substrate receiving surface 132 for supporting the substrate 105 and a stem 134 coupled to a lift system 136 to raise and lower the substrate support 130. A shadow frame 133 may be placed over periphery of the substrate 105 during processing. The shadow frame 133 is configured to prevent or reduce unwanted deposition from occurring on surfaces of the substrate support 130 that are not covered by the substrate 105 during processing. In one embodiment, the shadow frame 133 is generally rectangular and has rectangular opening therethrough for circumscribing the substrate 105. Lift pins 138 are moveably disposed through the substrate support 130 to move the substrate 105 to and from the substrate receiving surface 132 to facilitate substrate transfer. The substrate support 130 may also include heating and/or cooling elements 139 to maintain the substrate support 130 and substrate 105 positioned thereon at a desired temperature. The substrate support 130 may also include grounding straps 131 to provide RF grounding at the periphery of the substrate support 130.

The diffuser 110 is coupled to a backing plate 112 at its periphery by a suspension 114. The diffuser 110 may also be coupled to the backing plate 112 by one or more center supports 116 to help prevent sag and/or control the straightness/curvature of the diffuser 110. A gas source 120 is coupled to the backing plate 112 to provide one or more gases through the backing plate 112 to a plurality of gas passages 111 formed in the diffuser 110 and to the substrate receiving surface 132. Suitable gases may include, but are not limited to, a silicon containing gas, e.g., silane ($SiH_4$), and a nitrogen containing gas, e.g., nitrogen ($N_2$) and/or ammonia ($NH_3$). A vacuum pump 109 is coupled to the chamber 100 to control the pressure within the process volume 106. An RF power source 122 is coupled to the backing plate 112 and/or to the diffuser 110 to provide RF power to the diffuser 110 to generate an electric field between the diffuser 110 and the substrate support 130 so that a plasma may be formed from the gases present between the diffuser 110 and the substrate support 130. Various RF frequencies may be used, such as a frequency between about 0.3 MHz and about 200 MHz. In one embodiment, the RF power source 122 provides power to the diffuser 110 at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 and excited to form a remote plasma from which dissociated cleaning gas species are generated and provided to clean chamber components. The cleaning gas may be further excited by the RF power source 122 provided to flow through the diffuser 110 to reduce recombination of the dissociated cleaning gas species. Suitable cleaning gases include but are not limited to $NF_3$, $F_2$, and $SF_6$.

In one embodiment, the heating and/or cooling elements 139 may be utilized to maintain the temperature of the substrate support 130 and substrate 105 thereon during deposition less than about 400 degrees Celsius or less. In one embodiment, the heating and/or cooling elements 139 may used to control the substrate temperature to less than 100 degrees Celsius, such as between 20 degrees Celsius and about 90 degrees Celsius.

The spacing during deposition between a top surface of the substrate 105 disposed on the substrate receiving surface 132 and a bottom surface 140 of the diffuser 110 may be between about 400 mm and about 1,200 mm, for example between about 400 mm and about 800 mm, for example between about 400 mm to about 600 mm, for example about 500 mm. In one embodiment, the spacing between a top surface of the shadow frame 133 and the diffuser 110 is between about 275 mm and about 475 mm, for example about 375 mm. In one embodiment, the bottom surface 140 of the diffuser 110 may include a concave curvature wherein the center region is thinner than a peripheral region thereof, as shown in the cross-sectional view of FIG. 1.

The chamber 100 may be used to deposit a nitride, such as silicon nitride ($SiN_x$), using silane ($SiH_4$) gas and one or more nitrogen containing gases, e.g., nitrogen ($N_2$) and ammonia ($NH_3$), by a PECVD process which is widely used as a passivation layer, a gate insulator film, or a buffer layer in TFT and AMOLED. The uniformity (i.e., thickness) of the silicon nitride film has a significant impact on the final device performance, such as threshold voltage and drain current uniformity. In one embodiment, a film uniformity of about 5%, or less, across the surface of the substrate, as well as minimal edge exclusion, is desired. While many strides have been made toward this goal, there are regions of the substrate 105 where this uniformity is not achieved. For example, edges of the substrate, such as corner regions and sides of the substrate, experience a higher deposition rate which results in film thicknesses at these regions that is greater than other regions. Although not wishing to be bound by theory, the cause of the higher deposition rate in the edge regions is attributed to electromagnetic field variations and/or gas distribution adjacent these areas. An inventive spoiler has been developed and tested to overcome these effects and minimize non-uniformities in films formed on the substrate 105.

Figure 2:
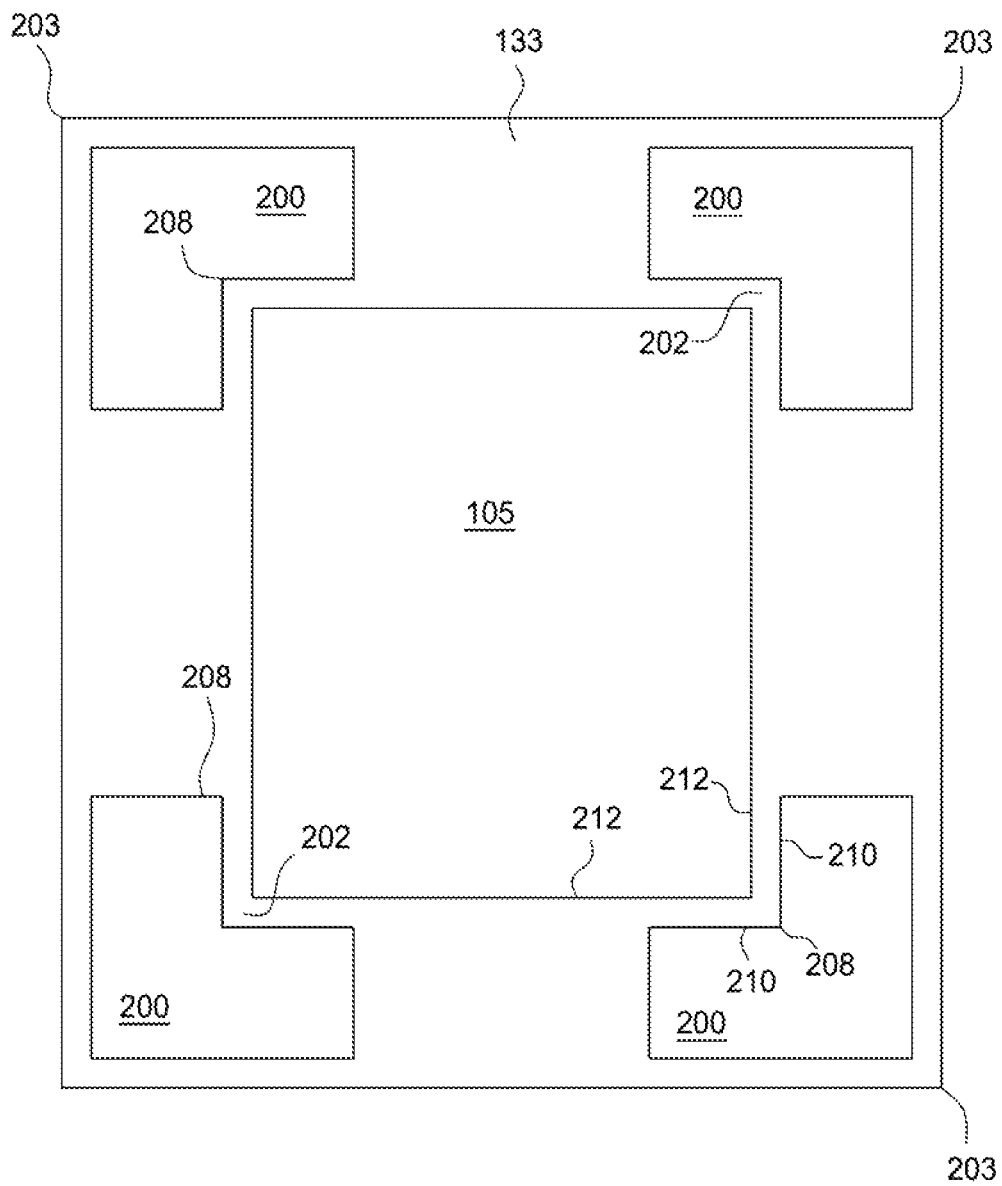
FIG. 2 is a plan view of one embodiment of a corner spoiler disposed on a portion of a shadow frame surrounding the substrate of FIG. 1.

FIG. 2 is a plan view of one embodiment of one or more corner spoilers 200 coupled to the top surface of the shadow frame 133. The corner spoiler 200 is configured to locally change the gas flow being deposited on the substrate 105 and "spoil" the non-uniform plasma distribution at the corner regions of the substrate 105. The corner spoiler 200 reduces high deposition rates, i.e., corner peaks, at the corner of the substrate 105, without affecting the large range uniformity profile of the substrate 105.

In the embodiment shown in FIG. 2, the substrate 105 and the shadow frame 133 have a rectangular shape, and the corner spoiler 200 has an L-shaped body. It is contemplated, however, that the corner spoiler 200 may have alternative shapes to account for different shaped substrates and different processing requirements. In one embodiment, the corner spoiler 200 is fabricated from a non-metal or glass material. For example, the corner spoiler 200 is fabricated from a dielectric material, such as aluminum oxide ($Al_2O_3$) or Teflon® (polytetrafluoroethylene). In another embodiment, the corner spoiler 200 is fabricated from the same material as the shadow frame 133, e.g., aluminum oxide. As one skilled in the art would appreciate, the material for the corner spoiler 200 may be selected based on the processing requirements.

Figure 3:
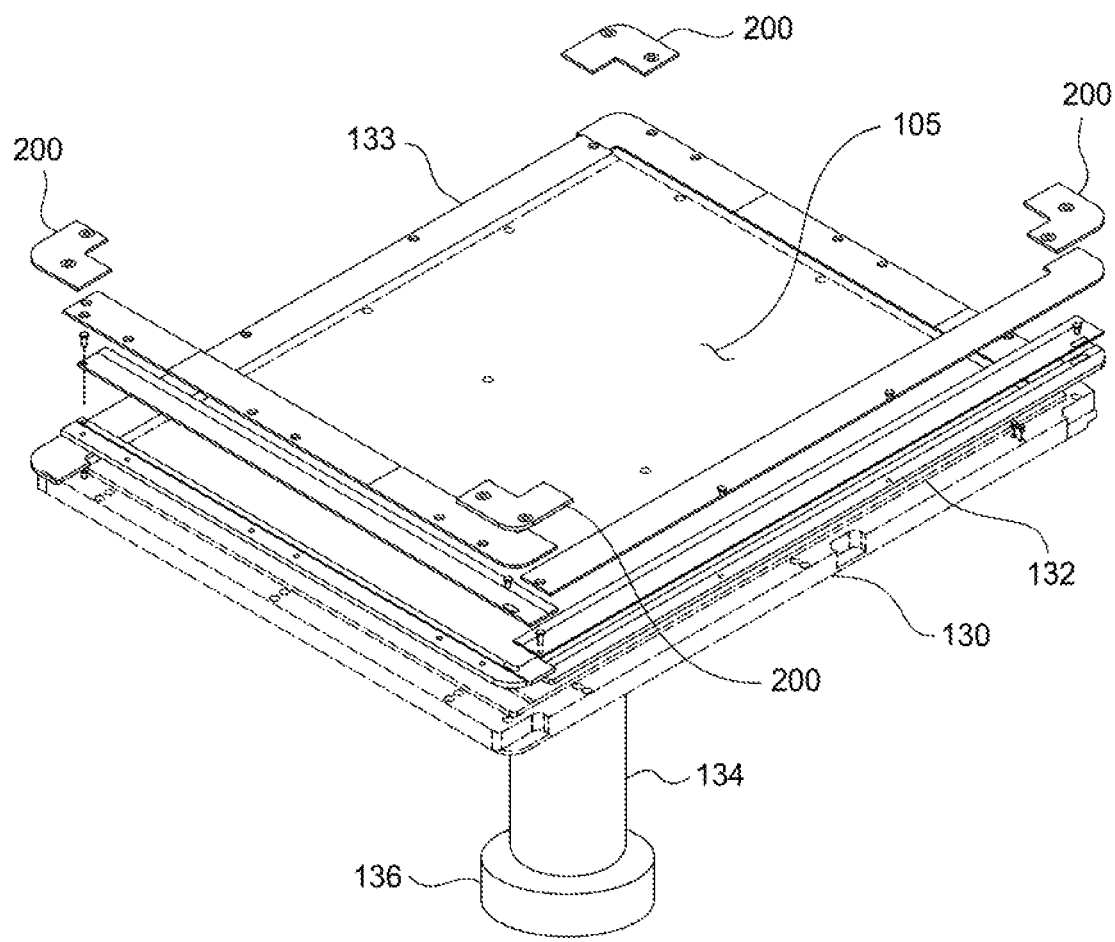
FIG. 3 is an exploded view of one embodiment of a corner spoiler disposed on a portion of a shadow frame surrounding the substrate of FIG. 1.

FIG. 3 is an exploded view of one embodiment of one or more corner spoilers 200 coupled to the top surface of the shadow frame 133. The corner spoilers 200 may be coupled to the shadow frame 133. The shadow frame is coupled to a peripheral edge of the substrate 105. The substrate 105 is disposed on a substrate receiving surface 132, which is disposed on a substrate support 130. The substrate support 130 is supported by a stem 134 which may be coupled to a lift system 136.

In one embodiment, the corner spoiler 200 may be coupled to the surface of the shadow frame 133 between an outside corner 203 and an inside corner 202 of the shadow frame 133 by one or more screws, Teflon® tape, or any other suitable means for coupling the corner spoiler 200. Advantageously, the corner spoiler 200 may be retrofitted to existing PECVD hardware, and removed with ease for maintenance or replacement. In another embodiment, the shadow frame 133 is die-casted or molded to include the corner spoilers 200 as a unitary structure, integrated with the shadow frame 133 body.

Figure 4:
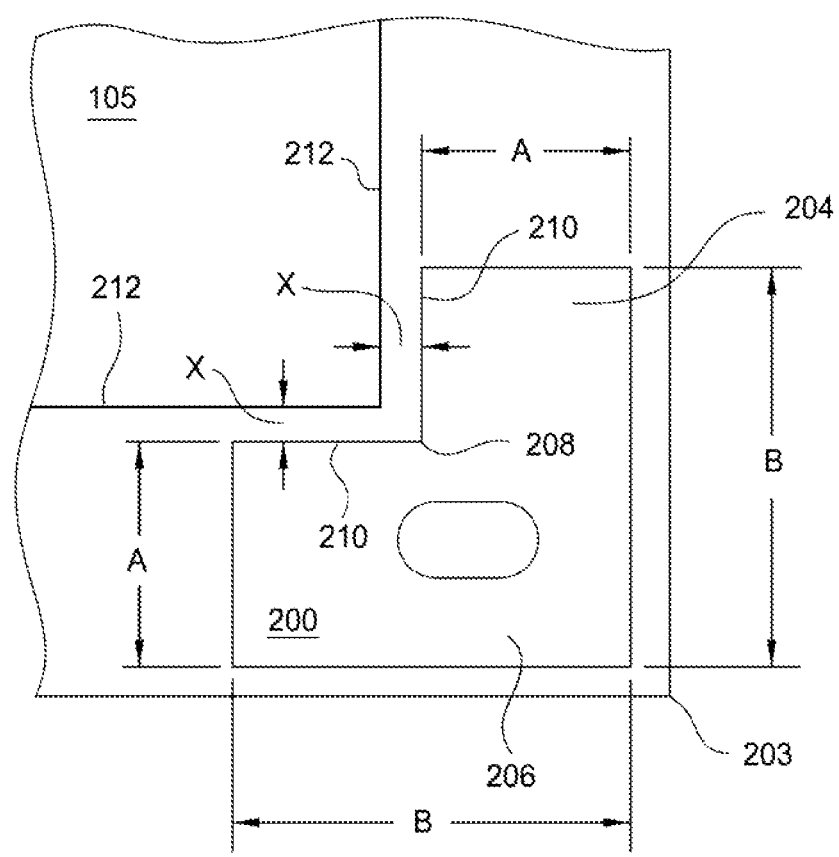
FIG. 4 is a close-up view of one embodiment of a corner spoiler disposed on a portion of a shadow frame surrounding the substrate of FIG. 1.

FIG. 4 is a close-up view of one embodiment of a corner spoiler 200. The L-shaped corner spoiler 200 includes a first leg 204 and a second leg 206. The first and second legs 204, 206 meet at an inside corner 208 to form an angle, which may be a 90 degree angle. In one embodiment, a horizontal or vertical distance (i.e., width) between a first end 209 of the legs 204, 206 and the inside corner 208 is defined as "A". A length or height of the legs 204, 206 is defined as "B", which is about two times the distance A. In one embodiment, A is between about 35 mm to about 55 mm, for example 45 mm, and B is between about 70 mm to about 110 mm, for example 90 mm. In one embodiment, the uniform thickness of the corner spoiler 200 is between about 3 mm to about 9 mm, for example about 6 mm. As one skilled in the art would appreciate, the above recited measurements of the corner spoiler 200 may also be selected based on the distance between the shadow frame 133 having the corner spoiler 200 thereon, and the diffuser 110. In one embodiment, the corner spoiler 200 is between about 0 mm and about 12 mm above the substrate support 130, for example about 3 mm or less, or about 6 mm, or about 9 mm.

In one embodiment, a distance between an inside 210 of the first and second legs 204, 206 and an inside edge 212 of the shadow frame 133 is defined as "X". As one skilled in the art would appreciate, the distance X governs: (1) how much the local gas flow changes before it is deposited on the substrate 105; and (2) how much the plasma distribution is "spoiled" at the corner regions of the substrate 105. In one embodiment, the distance X is selected based on the material of the film being formed on the substrate 105. For example, where nitrides are being formed on the substrate 105, X is between about 2 mm to about 15 mm, for example 10 mm. As such, the corner spoiler 200 is not limited to having an L-shaped body, rather, the corner spoiler 200 may have any suitable shape for forming the distance X between the shadow frame 133 and the inside surface of the corner spoiler 200.

Advantageously, embodiments of the corner spoiler 200 as described herein decrease the gas flow and compensate for high deposition rates on corner regions and/or edge regions of substrates. The corner spoiler 200 changes the local impedance of the plasma simultaneously brings down the strength of the plasma generated electric field by pushing it below a top surface (i.e., the height) of the corner spoiler 200 disposed on the shadow frame 133. Thereby, overall film thickness uniformity, and in particular at the corner regions of 30 mm or less edge exclusion, is improved.

Corner regions of a substrate similar to the substrate 105 were tested and the inventive corner spoiler 200 showed about a 3% (absolute value) reduction in the deposition rate, while maintaining the integrity of the film at the corner of the substrate. In addition, as a result, the diagonal uniformity over the whole substrate was improved from 5.6% at 15 mm edge exclusion to 3.5% at 15 mm edge exclusion, and from 4.7% at 20 mm edge exclusion to 3.4% at 20 mm edge exclusion. Furthermore, the average electric field in the space below the height of the corner spoiler decreased by about 50% in the range of 50 mm to the corner spoiler.

While the foregoing is directed to embodiments of the present disclosure, other and further embodiments of the disclosure may be devised without departing from the basic scope thereof, and the scope thereof is determined by the claims that follow.

The invention claimed is:

1. A shadow frame for a processing chamber comprising:
   a rectangular shaped body having a rectangular opening therethrough, an inside edge and an outside edge; and
   one or more corner spoilers coupled to a top surface of the rectangular shaped body at one or more corners of the rectangular shaped body and disposed within an area bounded by the inside edge and the outside edge of the rectangular shaped body, wherein the one or more corner spoilers comprises:
      an L-shaped body fabricated from a dielectric material, wherein the L-shaped body is configured to change plasma distribution at a corner of a substrate in the processing chamber, and wherein the L-shaped body comprises:
         a first leg has an end with an inside corner and an outside corner; and
         a second leg has an end with an inside corner and an outside corner, wherein the first and second legs meet at an inside corner and an outside corner of the L-shaped body.

2. The shadow frame of claim 1, wherein a horizontal distance between an inside edge of the first and second legs and the inside edge of the rectangular shaped body is between about 2 mm and about 15 mm.

3. A processing chamber, comprising:
   a substrate support disposed within the processing chamber, the substrate support having a substrate-receiving surface configured to support a substrate;
   a shadow frame disposed over a periphery of the substrate, the shadow frame having a rectangular shaped body having a rectangular opening therethrough, an inside edge and an outside edge; and one or more corner spoilers coupled to a top surface of the rectangular shaped body at one or more corners of the rectangular shaped body and disposed within an area bounded by the inside edge and the outside edge of the rectangular shaped body, each corner spoiler comprising:

an L-shaped body fabricated from a dielectric material, wherein the L-shaped body is further configured to change plasma distribution at a corner of a substrate in the processing chamber, and wherein the L-shaped body comprises:

a first leg has an end with an inside corner and an outside corner; and a second leg has an end with an inside corner and an outside corner, wherein the first and second legs meet at an inside corner and an outside corner of the L-shaped body, and wherein a distance between the inside corner and the outside corner of the end of the first leg is between about 35 mm and 55 mm and a distance between the inside corner and the outside corner of the end of the second leg is between about 35 mm and 55 mm.

4. The processing chamber of claim 3, wherein the dielectric material consists essentially of aluminum oxide or polytetrafluoroethylene.

5. The processing chamber of claim 3, wherein the one or more corner spoilers has a uniform thickness between about 3 mm and about 9 mm.

6. The processing chamber of claim 3, wherein a horizontal distance between an inside edge of the first and second legs and the inside edge of the rectangular shaped body is between about 2 mm and about 15 mm.

7. The processing chamber of claim 6, wherein the shadow frame comprises aluminum oxide or polytetrafluoroethylene.

8. The processing chamber of claim 3, further comprising: a diffuser disposed opposite the substrate.

9. The processing chamber of claim 8, wherein the diffuser comprises a center region having a first thickness and a peripheral region having a second thickness, wherein the first thickness is less than the second thickness.

10. The processing chamber of claim 8, wherein the distance between the diffuser and the substrate is between about 400 mm and about 1200 mm.

\* \* \* \* \*